United States Patent
Nelson

(10) Patent No.: US 11,061,992 B2
(45) Date of Patent: Jul. 13, 2021

(54) METHOD AND SYSTEM FOR OPTIMIZING A PROCESS

(71) Applicant: Albert Roland Nelson, St. Albert (CA)

(72) Inventor: Albert Roland Nelson, St. Albert (CA)

(*) Notice: Subject to any disclaimer, the term of this patent is extended or adjusted under 35 U.S.C. 154(b) by 422 days.

(21) Appl. No.: 15/905,380

(22) Filed: Feb. 26, 2018

(65) Prior Publication Data
US 2018/0246850 A1 Aug. 30, 2018

Related U.S. Application Data

(60) Provisional application No. 62/463,402, filed on Feb. 24, 2017.

(30) Foreign Application Priority Data

Feb. 24, 2017 (CA) .................................. CA 2958947

(51) Int. Cl.
  *G06F 17/10* (2006.01)
  *G06Q 10/04* (2012.01)
  *G06F 30/20* (2020.01)

(52) U.S. Cl.
  CPC .............. *G06F 17/10* (2013.01); *G06F 30/20* (2020.01); *G06Q 10/04* (2013.01)

(58) Field of Classification Search
  CPC .................................. G06F 30/20; G06Q 10/04
  See application file for complete search history.

(56) References Cited

U.S. PATENT DOCUMENTS

| | | | | |
|---|---|---|---|---|
| 2003/0014131 | A1* | 1/2003 | Havener | G05B 13/048 700/29 |
| 2004/0148049 | A1* | 7/2004 | Schwarm | G05B 17/02 700/121 |
| 2005/0171626 | A1* | 8/2005 | Schwarm | G05B 23/0294 700/108 |
| 2007/0250214 | A1* | 10/2007 | Lee | G05B 13/0275 700/266 |
| 2016/0203413 | A1* | 7/2016 | Ruiz | G06F 30/20 706/52 |
| 2017/0045573 | A1* | 2/2017 | Iskandar | G06F 30/00 |

OTHER PUBLICATIONS

Huang, Zhiheng, and Qiang Shen. "Fuzzy interpolation and extrapolation: A practical approach." IEEE Transactions on Fuzzy Systems 16, No. 1 (2008): 13-28. (Year: 2008).*

* cited by examiner

*Primary Examiner* — Chuen-Meei Gan
(74) *Attorney, Agent, or Firm* — Antony C. Edwards

(57) ABSTRACT

Optimizing a process includes identifying a plurality of optimizable variables, determining first and second set points for each optimizable variable, running first trials using the first or second set point to obtain an output having at least one measurable parameter, calculating a delta between a required value and the measured value of each parameter of each of the outputs, calculating a first true residual for the first set point and a second true residual for the second set point for each of the optimizable variables, calculating an interpolant between the first and second true residuals and an extrapolant outside the first and second true residuals for each of the optimizable variables, and applying a set of identification rules to select an optimized set point for each of the optimizable variables selected from either the interpolant or the extrapolant for each of the optimizable variables.

10 Claims, 5 Drawing Sheets

Graph 1: First and Second True Residuals, and Extrapolant and Interpolant, for Hold Pressure (Keyhole Part Case Study)

Graph 1: First and Second True Residuals, and Extrapolant and Interpolant, for Hold Pressure (Keyhole Part Case Study)

METHOD AND SYSTEM FOR OPTIMIZING A PROCESS

CROSS REFERENCE TO RELATED APPLICATIONS

This application claims priority to U.S. Patent Application No. 62/463,402 filed Feb. 24, 2017, entitled: "Method and System for Optimizing A Process" and Canadian Patent Application No. 2,958,947 filed on Feb. 24, 2017, entitled: "Method and System for Optimizing A Process" entireties of which are incorporated herein by reference.

TECHNICAL FIELD

The present disclosure relates to methods and systems for optimizing processes. Specifically, this disclosure relates to methods and systems for determining optimized set points for input variables of a given process so as to optimize the output of the process.

BACKGROUND

Processes typically consist of a series of inputs that result in a number of outputs. Often, it is desirable to improve or optimize the process so as to improve the outputs, by making adjustments to the inputs. Improvements to outputs, for example, may include improving the quality or quantity of the outputs and/or reducing the waste of the process outputs. However, for processes having multiple inputs and outputs, it may be difficult to determine what adjustments to which inputs will produce the improved outputs.

Taking a manufacturing process as an example, process inputs may include source materials of varying integrity, one or more units of manufacturing equipment or machines, and process set points associated with each of the machines being used. Process inputs may include both optimizable variables, which are input variables that may be adjusted to optimize the process, and predetermined variables which are typically static and do not change. For example, some process set points may be optimizable variables while other process set points may be predetermined variables for a given process. An example of a predetermined variable would be the heater band settings for a given material to be able to properly process the material through a machine.

Part of the difficulty in optimizing a process is that it is difficult to account for or predict the external factors which may impact a process. External factors are factors which may impact a process that are outside the control of the operator of the process. Examples of external factors include variations in atmospheric pressure, humidity and temperature in the process environment, as well as changes within units of manufacturing equipment that occur over time. As fluctuations in external factors occur, the operating range, or sweet spot, within which optimizable variables would operate most effectively to achieve the desired output may shift. In addition to external factors, there may also be internal factors outside the control of the process operator that may change over time, which may include for example electro-mechanical variations between different units of the same manufacturing machines or equipment. Even though two units of a particular type of equipment may be identical, the operating range or sweet spot for each of the two units may not be the same due to electro-mechanical variations between the two units. If a set point for a given optimizable variable happens to be at the periphery of the optimizable variable's sweet spot, one or more external factors may cause the sweet spot to shift to the extent that the set point falls outside the sweet spot, often causing a degradation in the quality of the process output.

Process outputs include both the product produced through the process, such as an article manufactured in a manufacturing process, as well as measurable parameters of the product or article. Measurable parameters, for example, may include product specifications, volume output, finish quality and the quantity of waste product produced. Product specifications may include, for example, requirements for the product's dimensions, weight, viscosity, operating specifications, or any other measurable parameters that conform to the desired quality of the product(s). The desired value for each of the measurable parameters is referred to herein as the required values.

To further complicate the overall understanding of a process, and the ability to predict how adjustments to optimizable variables will impact the process outputs, some of the optimizable variables are internally interrelated in that one variable may have influential effects over another variable. This concept requires additional consideration when trying to optimize a process; however, it may be very difficult to identify these interrelationships or how they will impact the process outputs.

The ability to effectively be able to optimize a process is considered an art form. Using a trial and error method along with intuitiveness from experience, a technician, or engineer, may adjust the set point of one or more optimizable variables and then review the resulting product(s) to determine whether the adjusted set points had the desired effect of bringing the product(s) within the product parameters. Such an optimization process is laborious as stabilization of the process is required before product(s) can be properly reviewed. Moreover, this trial and error method produces a great deal of unwanted waste product(s). Even if adjusting one or more set points of one or more optimizable variables improves the product(s) by bringing them closer to the product parameters or specifications, there is no way to determine whether such adjusted set points are truly optimized or whether additional changes to the one or more input variables would further improve the process.

Another means that is commonly used to optimize processes is the use of statistical analysis and design of experiments. This method, developed in the 1920s, involves a design of experiments used to strategically cover two or three potential variable changes in a series of trials to test whether one variable is statistically stronger than another in obtaining the desired outputs. The basic premise of the statistical analysis method asks the question, which tested variable is better, A or B or sometimes C? Since the calculations are based on averages, the answer becomes only valid if the second or third variable is significantly better than the first. This method does not point to an optimized value for a specific variable but suggests that one is statistically better than another. To identify optimized set points for the optimizable variables, several iterations or series of design of experiments must be completed. However, as such a method may involve considerable time and resources, it may not be possible to truly optimize the targeted optimizable variables due to lack of time and resources.

A more modern method of optimization developed in the 1980s and 1990s involves the use of computer modelling software. This software typically uses iterative methods, such as regression analysis and differential evolution (DE) analysis, amongst others, with the intention that the proposed models, involving mathematical equations, are an estimated representation of how the process works. Often users of this method will draft several (four to five) different models with the hope that one will reflect, or come close to, the actual circumstances that are being observed. In this method, equations are designed and initial inputs are put into the proposed models, and the output obtained from the models is a mathematical value that is supposed to be an improvement over the initial inputs. The output is then put into the proposed models as an input and the process is repeated for several iterations of calculations, after which the final output is supposed to be the optimized set point for a given optimizable variable. Thus, this process optimization method attempts to obtain an optimized set point by using computer modelling software, and does not utilize trials to run the process at different set points to measure the impact of the adjusted set points on the outputs. An issue with this method is that there is not a way to account for the error that is generated or to determine whether the optimized set points generated are correct, as the error generated is typically too great to be accepted as being true. Thus, there is a need for an improved process optimization method, requiring less time or other resources to implement, to identify optimized set points for several optimizable variables.

SUMMARY

The present disclosure provides a method and system for optimizing a process by determining the integrity of the set points of the optimizable variables based on a measurement of the impact of those set points on the process output. This improved method and system for process optimization advantageously may only require only one or two iterations, in order to identify the optimized set points of multiple optimizable variables. Advantageously, the new method of process optimization described herein may achieve identifying what is referred to herein as the center of the sweet spot for each optimizable variable's set point, which means that even if changes in the external and internal factors or the internal process environment, which have an impact on the overall process being optimized, may cause the sweet spot to drift for a given piece of equipment or process step, the process may continue producing outputs at a higher efficiency without interruption because the optimized set point still falls within the sweet spot of the optimizable variable to produce outputs within the desired product specification or parameters, despite the shifting of the sweet spot for a given optimizable variable.

In one embodiment of the present disclosure, the improved method for process optimization includes design of experiment (DOE) trials, in which the set point of each optimizable variable is adjusted between the first or second set point for that optimizable variable, which in some embodiments the first and second set points may be selected in the range of 10%-25% of the original set point value prior to optimizing the process. Once the DOE trials are designed, they are run and outputs from each trial may then be measured against the product parameters or specifications for the given output, and this data may be statistically analysed so as to determine the optimized set points for each of the input optimizable variables that were modified during the trials by reverse engineering the outputs through the data to derive the optimized set points. In some embodiments, a second set of mini-trials may be required to further analyse selected optimizable variables so as to further optimize those set points. In the applicant's experience, the application of the methods and systems disclosed herein may typically improve the efficiency of a given process by approximately 10% to 25%, the efficiency improvement measured for example by a reduction of waste, an improvement in the quality of the product or output produced in the process, an increased production rate, or other measurements of efficiency improvement that may be applicable to a given process.

An example of the advantages offered by the methods disclosed herein, not intended to be limiting, includes that the method and system disclosed herein may be utilized to avoid scrapping a mold for a manufactured product that is found to produce units falling outside the tolerances for the product. Molds for manufacturing products typically provide the basic shape of the product, but the actual dimensions of the product are impacted by the various process inputs, which may include optimizable variables. If the mold produces products that are only slightly outside the tolerances for the product parameters, utilizing the methods disclosed herein to optimize the set points so as to bring the measurable parameters of the product within the product parameter tolerances may enable a manufacturer to continue using the mold, rather than having to scrap the mold, which may be expensive to replace. This application is dependent upon the severity of the change and the limitations of the mold, or machine.

Although the example provided in the detailed description below to illustrate how the methods described herein may optimize a process is a specific manufacturing process, this is not intended to be limiting and it will be appreciated by a person skilled in the art that the methods disclosed herein may be applied to other processes, for example to optimize computer modelling software or the operation of a given unit(s) of machinery or equipment.

In a further embodiment of the present disclosure, the process optimization methods disclosed herein may be also applied to optimize a process in real time, otherwise referred to herein as advanced process control (APC). Advanced process control involves real time or near-real time optimization whereby the same optimization methods described herein may be applied to continually adjust the set points for a given set of input variables, whereby adjustments to the set points for each input variable is based upon a continual monitoring of the process outputs. Examples of the application of the methods disclosed herein in the context of APC include the optimization of fuel consumption of a motorized vehicle, or optimizing a manufacturing process in real time or near-real time.

Without intending to be limiting, the process optimization methods disclosed herein may be implemented with the assistance of a computer or processor loaded with software stored in tangible memory that performs the required calculations, and which in some embodiments may also automate some or all of the steps of the process optimization methods, such as performing the measurements of the measurable parameters on the outputs and setting the set points for equipment or machines at the determined optimized set point values. As a substitute for, or in addition to, the computer loaded with software, some or all of the process optimization steps may be carried out by electronic controllers, microprocessors, programmable logic controllers, sensors, and/or similar equipment.

In an aspect of the present disclosure, a method for optimizing a plurality of input variables for a process so as to improve one or more outputs, performed by a processor executing instructions in tangible memory, includes the steps of: identifying a plurality of optimizable variables; determining first and second set points for each optimizable variable of the plurality of optimizable variables; scheduling a plurality of trials wherein each trial of the plurality of trials utilizes the first or second set point for each optimizable variable; running each trial of the plurality of trials to obtain an output, each output having a plurality of measurable parameters; calculating a delta between a required value and a measured value of each measurable parameter of the plurality of measurable parameters of each output so as to obtain a plurality of deltas for each of the first and second set points of each optimizable variable; calculating a first true residual for the first set point and a second true residual for the second set point of each optimizable variable based on the plurality of deltas corresponding to the first and second set points of each optimizable variable; calculating an interpolant between the first and second true residuals and an extrapolant outside the first and second true residuals of each optimizable variable; applying a set of identification rules to select an optimized set point for each optimizable variable, selected from either the interpolant of the optimizable variable or the extrapolant of the optimizable variable.

In a further aspect of the present disclosure, where applying the set of identification rules did not result in selecting the optimized set point for at least one optimizable variable, the method for optimizing a process may further include the steps of: identifying the at least one optimizable variable of the plurality of optimizable variables for which the optimized set point remains to be determined; determining the third and fourth set points for each optimizable variable of the at least one optimizable variable; scheduling a plurality of trials wherein each trial of the plurality of trials utilizes the third or fourth set point for each optimizable variable of the at least one optimizable variable; running each mini-trial of the plurality of mini-trials to obtain a mini-output, each mini-output having the plurality of measurable parameters; calculating the delta between the required value and the measured value of each measurable parameter of the plurality of measurable parameters of each mini-output, so as to obtain a plurality of mini-deltas for each of the third and fourth set points of each optimizable variable of the at least one optimizable variable; calculating a third true residual for the third set point and a fourth true residual for the fourth set point of each optimizable variable of the at least one optimizable variable; calculating a mini-interpolant between the third and fourth true residuals of each optimizable variable of the at least one optimizable variable; setting the optimized set point for each optimizable variable of the at least one optimizable variable, the optimized set point being the mini-interpolant for that optimizable variable.

In a further aspect of the present disclosure, the method may further include, in the step of identifying a plurality of optimizable variables, also identifying one or more predetermined variables and determining a set point for each predetermined variable of the one or more predetermined variables, and wherein the step of scheduling the plurality of trials further includes setting each predetermined variable at the set point corresponding to the predetermined variable for each trial of the plurality of trials.

In a further aspect of the present disclosure, in the methods described above, the step of running each trial of the plurality of trials to obtain an output may further include running each trial of the plurality of trials to obtain a quantity of outputs producing a sufficient plurality of deltas to provide optimized set points having a statistical accuracy of at least 95%.

In still a further aspect of the present disclosure, in the methods described above, the step of determining the first and second set points for some or all of the plurality of optimizable variables includes determining the first set point to be a presently utilized value and determining the second set point to be selected from a group comprising: a value in the range of substantially, meaning more or less as would be known to one skilled in the art, 10%-25% less than the presently utilized value, a value in the range of substantially 10%-25% greater than the presently utilized value.

BRIEF DESCRIPTION OF THE DRAWINGS

FIGS. 3, 3A and 3B are a flow diagram illustrating an alternative embodiment of the present disclosure.

DETAILED DESCRIPTION

Figure 1:
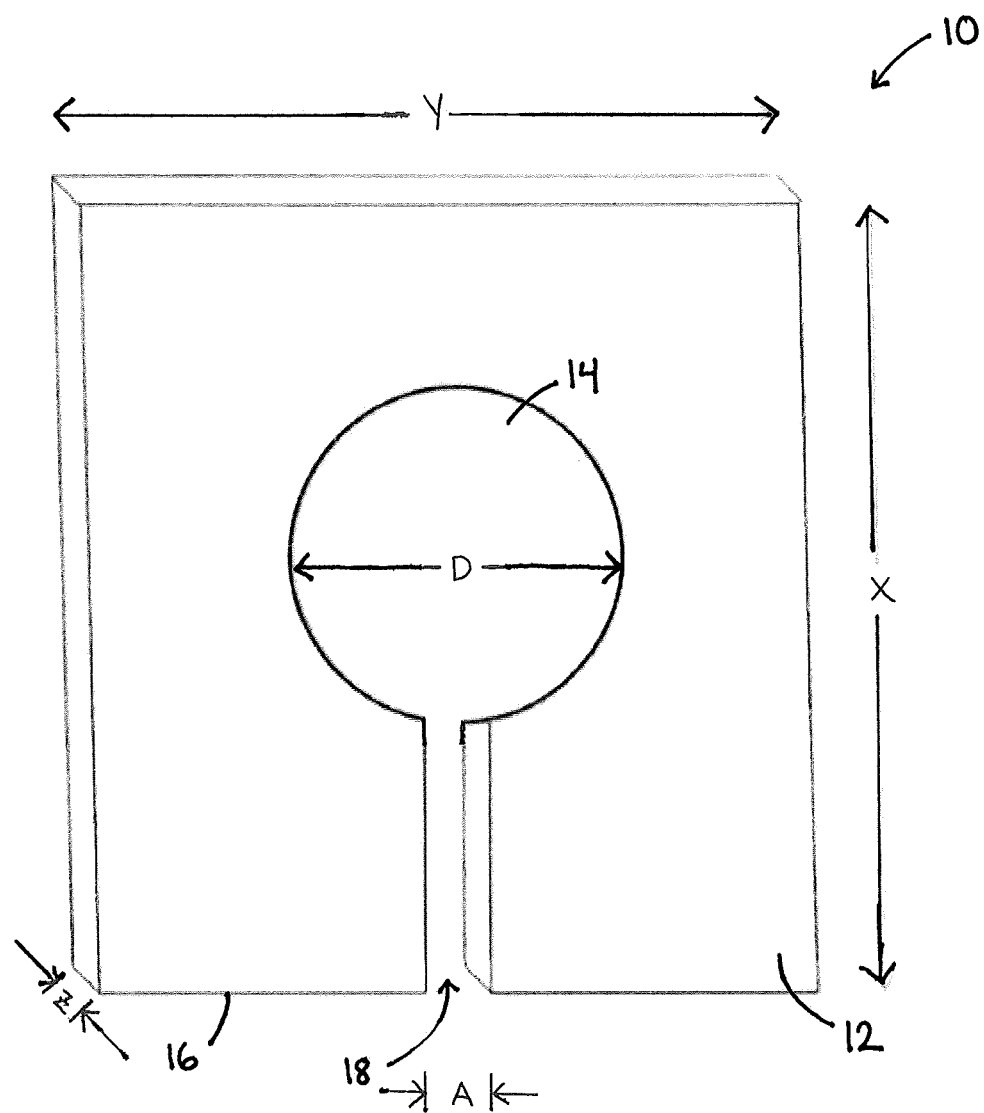
FIG. 1 is a front perspective view of a keyhole part.

In accordance with the present disclosure, embodiments will now be described with reference to the optimization of an example of a manufacturing process, to illustrate how the process optimization method and system may work on a real-life manufacturing process. It will be appreciated by a person skilled in the art that the example of the manufacturing process described herein is for illustration purposes only and that the process optimization methods and systems described herein may be applied to any process which involves multiple input variables having set points that may be adjusted, and having outputs with measurable product parameters or specifications that define the parameters of the desired output. As will be further described below, some embodiments of the present disclosure apply the same principles to APC systems, wherein the set points of input variables for a given process, such as optimizing the fuel consumption of a motorized vehicle, may be adjusted in real time so as to optimize those set points for a given operating mode of the vehicle (or other process) at a particular point in time.

Without intending to be limiting, a case study will be described herein to illustrate how the process optimization method works to improve the overall efficiency of the process. In this example, a keyhole part 10 is manufactured by injection molding. The keyhole part 10 is made of polyethylene terephthalate glycol (PETG) using a Wittmann Battenfeld injection molding machine. In this case study, the keyhole part 10 often failed quality assurance tests for the customer application, with scrap rates averaging in the range of 2-3%, occasionally rising to approximately 10% when anomalies in the external environment, such as higher levels of humidity, were introduced.

The manufacturing process for manufacturing the keyhole part 10 includes a number of input variables, representing adjustments to the injection molding machine itself or the manufacturing materials that are fed into the injection molding machine. Such input variables include both optimizable variables, which are input variables that may be modified so as to optimize the overall manufacturing process, and predetermined variables, which are input variables having set points that were not modified. In the keyhole part case study described herein, Table 1 below sets out eleven optimizable variables, including the hold pressure, cooling time, mold temperature, injection speed, hold time, back pressure, cut off pressure, full cut off, decomposition afterfeed, feed speed, and barrel temperature tip. Table 1 further displays the existing set points and what are referred to as the new, or adjusted, set points for each optimizable variable; for example, the hold pressure in the keyhole part example had an existing set point of 110 bar, and a new or adjusted set point of 100 bar.

In this example, the mold that is used only defines the basic shape that the keyhole part 10 will take. Molds are designed to allow for shrinkage of a product and shrinkage may occur in any or all directions and to varying degrees depending on the processing to the mold. Each of the variables in Table 1 below contributes to the finished product and may have an impact on one or more of the product parameters set out in Table 3, below. Adjustment of any or all of the optimizable variables may either stretch (due to excess pressure) or shrink (due to cooling shrinkage) any of the measureable parameters of the finished product. The product parameters in Table 3 define the desired parameters of the keyhole part 10, also referred to as the required values. The finished product may be measured to determine the value of each of the product parameters, referred to herein as the measurable parameters. If any of the measured values of the measurable parameters fall outside the tolerances for a given product parameter, then the product may be scrapped.

TABLE 1

Optimizable Variables (Inputs)

| Optimizable Variables | Set Point 1 | Set Point 2 | Units |
|---|---|---|---|
| Hold Pressure | 110 | 100 | bar |
| Colling Time | 15 | 12 | sec |
| Mold Temp | 155 | 140 | F. |
| Injection Speed | 28 | 35 | mm/sec |
| Hold Time | 14 | 11 | sec |
| Back Pressure | 7 | 4 | bar |
| Cut Off Pressure | 140 | 120 | bar |
| Full Cut Off | 95 | 92 | % |
| Decomp | 6 | 3 | bar |
| Afterfeed | | | |
| Feed Speed | 18 | 23 | mm/sec |
| Barrel Temp Tip | 400 | 380 | F. |

TABLE 2

Predetermined Variables (Inputs)

| Predetermined Variables | Value | Units |
|---|---|---|
| Barrel Temp 1 | 500 | F. |
| Barrel Temp 2 | 500 | F. |
| Barrel Temp 3 | 500 | F. |
| Barrel Temp 4 | 500 | F. |
| Barrel Temp 5 | 460 | F. |
| Barrel Temp 6 | 420 | F. |

The manufacturing process for the keyhole part example further includes a number of predetermined variables which are not modified for a given process. In Table 2 above, there are six set variables for the process of manufacturing the keyhole part 10, which include different temperatures at which the barrel is set during the manufacturing process; just by way of example, the first barrel temperature is 500 F; the second barrel temperature is 500 F; etc. These settings are typically predetermined and are dependent upon the processing melt temperature. However, the last variable in Table 1, the Barrel Tip Temperature, was included as part of the Optimizable Variable group to balance the increase in temperature from frictional energy from an increased Injection Speed. Table 2 only provides additional information to provide documentation as to the full embodiment of the process and is not included in any of the calculations.

The output of a given manufacturing process includes both the products that are produced and the measurable parameters of those products. Thus, in the example of the keyhole part case study, the manufacturing process described above is to manufacture a keyhole part 10, as illustrated for example in FIG. 1, the keyhole part 10 comprising a body 12 having an aperture 14 running through the body 12. Additionally, there is a slot 18 running from a lower edge 16 of the body 12 to the aperture 14. Thus, in this example, the measurable parameters include the body 12 having a length X, a width Y, a depth Z, each of which are measured in millimeters. Furthermore, the slot 18 has a width A, and the aperture 14 has a diameter D. Additionally, the overall weight of the keyhole part 10 may be measured in grams, and the overall percentage of keyhole parts 10 that are produced by the manufacturing process which fall within the tolerance ranges for the product specifications may be referred to, for example, as "percent good".

Each measurable parameter listed in Table 3 below may be measured and compared against the required value, or in other words, the value for that measurable parameter that is desired for the keyhole part 10. For example, the length X of the body 12 may have a required value of 150 mm, which is the desired value for each unit of the keyhole part 10 produced by the manufacturing process.

TABLE 3

Measurable Parameters (Outputs)

| Measurable Parameters | Required Value | Units |
|---|---|---|
| Length (X) | 150 | mm |
| Width (Y) | 70 | mm |
| Depth (Z) | 10 | mm |
| Gap width (A) | 2 | mm |
| Diameter (B) | 25 | mm |
| Mass | 75 | g |
| Percent Good | 100 | % |

As discussed earlier, the set points for each of the optimizable variables may impact the manufacturing process and may have an impact on any of the measurable parameters of the process output. For example, the length X of the body 12 of any given unit of the keyhole part 10 may have a measured value that is slightly greater or lesser than the required value of 150 mm. Thus, in this example, the measurement of each of the product specifications for each unit of the keyhole part 10 produced may provide a means of measuring whether the overall manufacturing process has been optimized, by providing measurable performance criteria as compared to the product parameters and their required values, and measuring how close a given unit of the keyhole part 10 comes to the required value of each product parameter.

Figure 2:
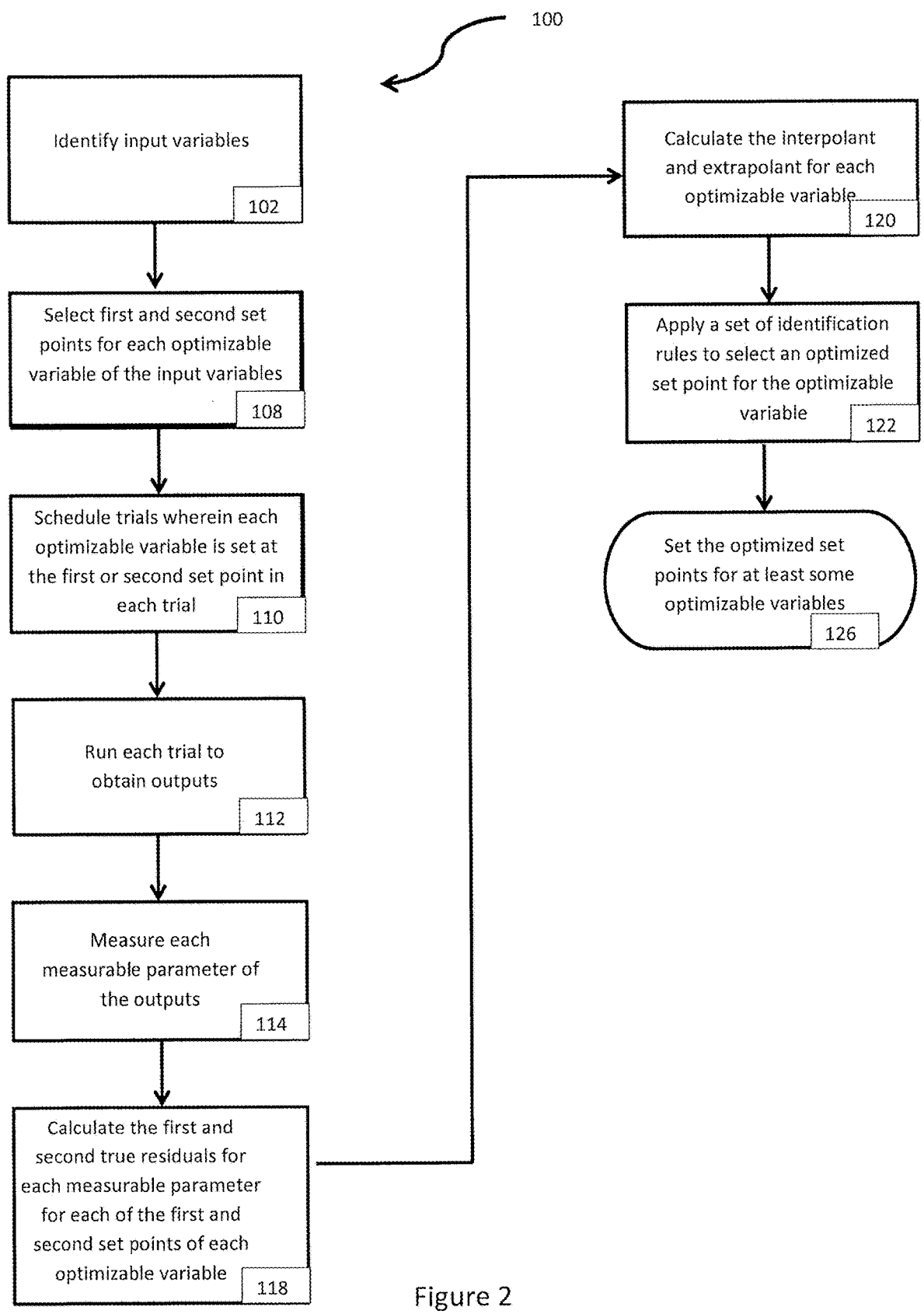
FIG. 2 is a flow diagram illustrating an embodiment of the present disclosure.

With reference to FIG. 2, in an embodiment of the present disclosure the process optimization method 100 may include identifying, at step 102, the input variables for a given process to be optimized. The input variables will include optimizable variables, and may also include predetermined variables, depending on the process being optimized. For processes including predetermined variables, the set point for each of the predetermined variables is held at a constant value for all of the trials.

At step 108, first and second set points are determined for each of the optimizable variables identified in step 102. Without intending to be limiting, in some embodiments of the present disclosure, the first set point for each optimizable variable may be the existing set point in use for that optimizable variable. The second set point for each optimizable variable may be selected so as to be different from the first set point. In the applicant's experience, as a starting point it seems advisable to select a second set point that is in the range of approximately or substantially, meaning more or less as would be known to one skilled in the art, 10%-25% greater or lesser than the first set point. The goal, when designing the trials based on a combination of the first and second set points for each of the optimizable variables is to select first and second set points for each variable that are different enough so as to produce a measurable difference in the measurable parameters of the outputs from each trial, as the differences in the measurable parameters of the outputs from each trial is utilized to conduct a statistical analysis of the adjustments to each optimizable variable so as to calculate the optimized set point for each optimizable variable. On the other hand, the first and second set points must be selected to remain within the operational limitations of the equipment, machine or process that are relevant to the particular optimizable variable. The range of difference between the first and second set points for each optimizable variable strikes a balance between producing enough of a change in the set points so as to produce a measurable difference in the output of each trial, while at the same time avoiding process failure caused by the set points of the optimizable variables falling outside the limitations of the process. However, the rules described above for selecting the first and second set point described above is not intending to be limiting, and other rules may be applied to select the first and second set points for each optimizable variable and are intended to be included in the scope of the present disclosure.

Without intending to be limiting, an example of how the first and second set points of each optimizable variable may be selected at step 108, as set out in Table 1 for the keyhole part case study, the hold pressure optimizable variable has a first set point of 110 bar, which in that example was the existing set point used for the hold pressure of the keyhole part manufacturing process prior to applying the process optimization method 100, and a second set point of 100 bar, which is 9.1% lower than the first set point. For the cooling time optimizable variable, the first set point was 15 seconds and the second set point was 12 seconds, representing a 20% reduction in the hold time between the first and second set points. In embodiments where the first set point is defined as the existing set point for that optimizable variable, it is also possible to increase the value of the second set point relative to the first set point. For example, in the keyhole part case study, the optimizable variable of injection speed has a first set point of 28 mm/s, being the existing injection speed of the manufacturing process prior to optimization, and the second set point is 35 mm/s, representing a 25% increase in the injection speed between the first and second set points.

At step 110 of the process optimization method, a series of trials may be scheduled, involving the design of experiments, for the purpose of gathering data regarding the impact of adjusting each of the optimizable variables between the first or second set points on the outputs of the process. In some embodiments, the design of experiments may result in a series of trials where the number of trials in the series is equal to one more than the number of optimizable variables, wherein for each optimizable variable, half of the trials will utilize the first set point and the other half of the trials will utilize the second set point. As may be seen in Table 4 below, for the keyhole part example, there are eleven optimizable variables and twelve trials. The matrix of set points used for each of the optimizable variables in each trial is arranged orthogonally to achieve an independent placement of the set points for each optimizable variable, such that each trial in the series of trials uses a unique combination of first or second set points for each optimizable variable, for example in accordance with a design of experiments described by Dr. Genichi Taguchi. However, it will be appreciated by a person skilled in the art that other designs of experiments may be utilized to design and schedule the series of trials for the method disclosed herein and are intended to be included in the scope of the present disclosure. At step 112 of the method, each trial of the series of trials scheduled in step 110 is run, whereby the optimizable variables are adjusted to either the first or second set points in each trial, as indicated in Table 4 below, and then the process is run to obtain outputs from each trial.

By way of example, in step 112 and referring to Table 4 below, the first trial involves running the manufacturing process using either the first or second set points for each of the eleven variables, as shown in the Table 4 row for Trial 1—in other words, the hold pressure is set to 110 bar; the cooling time is set to 15 seconds; the mold temperature is set to 155 degrees F., etc.

In some embodiments, each trial in the series of trials would be run so as to obtain a specified amount of output to collect a sufficient amount of data on the measurable parameters allowing calculation of the optimized set points to come within 95% or greater statistical accuracy. The specified amount of output for each trial required to attain 95% or greater statistical accuracy is a function of the number of measurable parameters, and the number of trials run. Just as an example, the number of outputs required to attain a statistical accuracy of 95% or greater may require at least 50 measured values obtained from measuring the measurable parameters of each product output from a manufacturing process. In the keyhole part example, because there are seven measurable parameters and six of the twelve trials that will utilize one of the two set points for each optimizable variable, obtaining five products from each trial will result in a total of 210 measured values for each set point of each optimizable variable (210 being the product of multiplying seven measurable parameters by six trials by five units per trial; or in other words, 5×6×7=210).

Although some embodiments of the methods disclosed herein will specify an amount or number of outputs required to attain at least 95% statistical accuracy in the calculation of the optimized set points, it will be appreciated by a person skilled in the art that other statistical accuracy thresholds that are greater than or lesser than 95% may also be applied and are intended to be included in the scope of the present disclosure.

TABLE 4

Trial Design—Matrix of Optimizable Variables
Optimizable Variables

| Trials | Hold Pressure bar | Cooling Time sec | Mold Temp F. | Injection Speed mm/sec | Hold Time sec | Back Pressure bar | Cut Off Pressure bar | Full Cut Off % | Decomp Afterfeed bar | Feed Speed mm/sec | Barrel Temp Tip F. |
|---|---|---|---|---|---|---|---|---|---|---|---|
| 1 | 110 | 15 | 155 | 35 | 14 | 7 | 140 | 95 | 6 | 23 | 400 |
| 2 | 110 | 15 | 155 | 35 | 14 | 4 | 120 | 92 | 3 | 18 | 380 |
| 3 | 110 | 15 | 140 | 28 | 11 | 7 | 140 | 95 | 3 | 18 | 380 |
| 4 | 110 | 12 | 155 | 28 | 11 | 7 | 120 | 92 | 6 | 23 | 380 |
| 5 | 110 | 12 | 140 | 35 | 11 | 4 | 140 | 92 | 6 | 18 | 400 |
| 6 | 110 | 12 | 140 | 28 | 14 | 4 | 120 | 95 | 3 | 23 | 400 |
| 7 | 100 | 15 | 140 | 28 | 14 | 7 | 120 | 92 | 6 | 18 | 400 |
| 8 | 100 | 15 | 140 | 35 | 11 | 4 | 120 | 95 | 6 | 23 | 380 |
| 9 | 100 | 15 | 155 | 28 | 11 | 4 | 140 | 92 | 3 | 23 | 400 |
| 10 | 100 | 12 | 140 | 35 | 14 | 7 | 140 | 92 | 3 | 23 | 380 |
| 11 | 100 | 12 | 155 | 28 | 14 | 4 | 140 | 95 | 6 | 18 | 380 |
| 12 | 100 | 12 | 155 | 35 | 11 | 7 | 120 | 95 | 3 | 18 | 400 |

In step 114 of the method, each of the measurable parameters of the product specification (in the example of a manufacturing process) would be measured for each unit of the units produced in each trial that was run in step 112. Again referring to the keyhole part case study, Table 5 provides the data obtained for the measurable parameter length X of the body 12 of keyhole part 10 (see FIG. 1), for each unit of the five units obtained from each of the twelve trials. For example, the first trial produced five units of the keyhole part, and those five units had a measured length X of body 12 of 150.75 mm, 150.8 mm, 150.85 mm, 150.7 mm and 150.77 mm, respectively. Similarly, for illustration purposes, the measured values of each of the other measured variables for each of the five units obtained from each of the twelve trials are set out below in Table 6 (for measurable parameter width Y of body 12); Table 7 (for measurable parameter depth Z of body 12); Table 8 (for slot width A of slot 18); Table 9 (for diameter D of aperture 14); Table 10 (for the weight of body 12); and Table 11 (for the percentage of units produced that fall within the tolerance limits of the product specification).

TABLE 5

Measured Values of Measurable parameter, Length (X)
Required Value for Measurable parameter - Length (X) - 150 mm

| | Output Products | | | | |
|---|---|---|---|---|---|
| Trials | 1 | 2 | 3 | 4 | 5 |
| 1 | 150.75 | 150.8 | 150.85 | 150.7 | 150.77 |
| 2 | 151.5 | 151.7 | 151.8 | 151.6 | 151.4 |
| 3 | 148.5 | 148.7 | 148.6 | 148.4 | 148.3 |
| 4 | 151.05 | 151.08 | 151.1 | 151.02 | 151.04 |
| 5 | 148.5 | 148.8 | 148.6 | 148.4 | 148.7 |
| 6 | 149.25 | 149.3 | 149.2 | 149.32 | 149.22 |
| 7 | 147.75 | 147.8 | 147.85 | 147.65 | 147.66 |
| 8 | 147.45 | 147.5 | 147.52 | 147.4 | 147.42 |
| 9 | 148.8 | 148.9 | 148.95 | 148.7 | 148.65 |
| 10 | 147 | 147.5 | 147.8 | 146.3 | 146.9 |
| 11 | 149.1 | 149.8 | 148.5 | 148.7 | 148.9 |
| 12 | 148.5 | 148.9 | 149 | 147.8 | 147.9 |

TABLE 6

Measured Values of Measurable parameter, Width (Y)
Required Value for Measurable parameter - Width (Y) - 70 mm

| | Output Products | | | | |
|---|---|---|---|---|---|
| Trials | 1 | 2 | 3 | 4 | 5 |
| 1 | 70.35 | 70.4 | 70.45 | 70.29 | 70.3 |
| 2 | 70.7 | 70.8 | 70.82 | 70.62 | 70.58 |
| 3 | 69.3 | 69.4 | 69.42 | 69 | 68.3 |
| 4 | 70.49 | 70.55 | 70.45 | 70.42 | 70.53 |
| 5 | 69.3 | 69.42 | 69.25 | 69.36 | 69.68 |
| 6 | 69.65 | 69.7 | 69.74 | 69.58 | 69.62 |
| 7 | 68.95 | 68.88 | 69 | 69.2 | 68.89 |
| 8 | 68.81 | 68.85 | 68.89 | 68.75 | 68.73 |
| 9 | 69.44 | 69.5 | 69.4 | 69.38 | 69.52 |
| 10 | 68.6 | 68.72 | 68.65 | 68 | 67.88 |
| 11 | 69.58 | 69.62 | 69.65 | 69 | 69.2 |
| 12 | 69.3 | 69.38 | 69.41 | 68.89 | 68.95 |

TABLE 7

Measured Values of Measurable parameter, Depth (Z)
Required Value for Measurable parameter - Depth (Z) - 10 mm

| | Output Products | | | | |
|---|---|---|---|---|---|
| Trials | 1 | 2 | 3 | 4 | 5 |
| 1 | 10.05 | 10.07 | 10.09 | 10.04 | 10.07 |
| 2 | 10.1 | 10.13 | 10.15 | 10.08 | 10.07 |
| 3 | 9.9 | 9.95 | 9.98 | 9.86 | 9.84 |
| 4 | 10.07 | 10.15 | 10.05 | 10.09 | 10.06 |
| 5 | 9.9 | 9.96 | 9.99 | 9.88 | 9.86 |
| 6 | 9.95 | 9.98 | 9.99 | 10 | 9.89 |
| 7 | 9.85 | 9.88 | 9.82 | 9.8 | 9.86 |
| 8 | 9.83 | 9.86 | 9.81 | 9.85 | 9.8 |
| 9 | 9.92 | 9.95 | 9.98 | 9.87 | 9.88 |
| 10 | 9.8 | 9.85 | 9.87 | 9.74 | 9.77 |
| 11 | 9.94 | 9.97 | 9.92 | 9.9 | 9.96 |
| 12 | 9.9 | 9.85 | 9.87 | 9.92 | 9.95 |

TABLE 8

Measured Values of Measurable parameter, Slot Width (A)
Required Value for Measurable parameter - Slot Width (A) - 2 mm

| | Output Products | | | | |
|---|---|---|---|---|---|
| Trials | 1 | 2 | 3 | 4 | 5 |
| 1 | 1.99 | 1.97 | 2.01 | 1.98 | 2 |
| 2 | 1.98 | 1.99 | 1.96 | 1.97 | 2 |
| 3 | 2.02 | 2.01 | 2.04 | 2.02 | 2.01 |
| 4 | 1.986 | 1.99 | 1.97 | 2 | 1.98 |
| 5 | 2.02 | 2.01 | 2.03 | 2.03 | 2.02 |
| 6 | 2.01 | 2.02 | 2.01 | 2 | 2.01 |
| 7 | 2.03 | 2.04 | 2.02 | 2.03 | 2.025 |
| 8 | 2.034 | 2.04 | 2.03 | 2.025 | 2.03 |
| 9 | 2.016 | 2.02 | 2.03 | 2.01 | 2.015 |
| 10 | 2.04 | 2.05 | 2.03 | 2.035 | 2.04 |
| 11 | 2.012 | 2.02 | 2.01 | 2.007 | 2.01 |
| 12 | 2.02 | 2.03 | 2.01 | 2.035 | 2.015 |

TABLE 9

Measured Values of Measurable parameter, Diameter (D)
Required Value for Measurable parameter - Diameter(D) - 25 mm

| | Output Products | | | | |
|---|---|---|---|---|---|
| Trials | 1 | 2 | 3 | 4 | 5 |
| 1 | 24.875 | 24.89 | 24.9 | 24.85 | 24.86 |
| 2 | 24.75 | 24.77 | 24.78 | 24.72 | 24.73 |
| 3 | 25.25 | 25.27 | 25.21 | 25.2 | 25.26 |
| 4 | 24.825 | 24.85 | 24.83 | 24.8 | 24.82 |
| 5 | 25.25 | 25.28 | 25.26 | 25.18 | 25.2 |
| 6 | 25.125 | 25.13 | 25.14 | 25.12 | 25.11 |
| 7 | 25.375 | 25.38 | 25.35 | 25.36 | 25.37 |
| 8 | 25.425 | 25.43 | 25.44 | 25.42 | 25.41 |
| 9 | 25.2 | 25.23 | 25.18 | 25.17 | 25.21 |
| 10 | 25.5 | 25.52 | 25.51 | 25.47 | 25.48 |
| 11 | 25.15 | 25.18 | 25.19 | 25.12 | 25.14 |
| 12 | 25.25 | 25.29 | 25.26 | 25.21 | 25.23 |

TABLE 10

Measured Values of Measurable parameter, Mass
Required Value for Measurable parameter - Mass - 75 g

| | Output Products | | | | |
|---|---|---|---|---|---|
| Trials | 1 | 2 | 3 | 4 | 5 |
| 1 | 75.375 | 75.38 | 75.39 | 75.35 | 75.36 |
| 2 | 75.75 | 75.78 | 75.71 | 75.72 | 75.8 |
| 3 | 74.25 | 74.32 | 74.28 | 74.21 | 74.19 |
| 4 | 75.525 | 75.54 | 75.53 | 75.5 | 75.51 |
| 5 | 75.25 | 75.21 | 75.2 | 75.3 | 75.19 |
| 6 | 74.625 | 74.64 | 74.68 | 74.58 | 74.6 |
| 7 | 73.825 | 73.77 | 73.85 | 73.84 | 73.8 |
| 8 | 73.725 | 73.75 | 73.77 | 73.68 | 73.69 |
| 9 | 74.4 | 74.45 | 74.42 | 74.36 | 74.38 |
| 10 | 73.5 | 73.56 | 73.48 | 73.46 | 73.52 |
| 11 | 74.5 | 74.6 | 74.59 | 74.51 | 74.52 |
| 12 | 74.25 | 74.29 | 74.19 | 74.22 | 74.26 |

TABLE 11

Measured Values of Measurable parameter, Percent Good
Required Value for Measurable parameter -Percent Good 100 Units: %

| | Output Products | | | | |
|---|---|---|---|---|---|
| Trials | 1 | 2 | 3 | 4 | 5 |
| 1 | 99.4 | 99.6 | 99.2 | 99.3 | 99.4 |
| 2 | 99.8 | 100 | 99.9 | 99.6 | 99.7 |
| 3 | 98.3 | 98.5 | 98.1 | 98.2 | 98.2 |
| 4 | 99.6 | 99.8 | 99.4 | 99.5 | 99.6 |
| 5 | 98.3 | 98.6 | 98 | 98.1 | 98.2 |
| 6 | 99 | 99.3 | 99.2 | 98.6 | 98.8 |
| 7 | 97.6 | 97.9 | 97.7 | 97.3 | 97.2 |
| 8 | 97.3 | 97 | 96.8 | 97.6 | 97.3 |
| 9 | 99.2 | 99 | 99.5 | 98.8 | 99.3 |
| 10 | 96.7 | 96 | 96.2 | 96.5 | 96.8 |
| 11 | 98.8 | 99 | 98.5 | 98.3 | 98.9 |
| 12 | 98.3 | 98.5 | 97.7 | 97.9 | 98.1 |

In step 118 of the process optimization method, the measured value data for each measurable parameter is utilized to calculate what the applicant refers to herein as the true residual, which is a unitless measurement of the difference between the required value and the measured value for each measurable parameter of each output unit. The true residual is distinguished from what is commonly understood by a person skilled in the art to be a residual, used in the calculation of variance and standard deviation. In a typical case of sum of squares analysis, the residual is calculated based on the distance between an average value of the measured parameter and the measured value of the measured parameter, typically expressed as follows:

$$(\bar{x}_i - x)^2$$

wherein $\bar{x}_i$ is the average value for the i-th measurable parameter, and $x_i$ is the measured value for the i-th measurable parameter. However, the applicant has found that residuals calculated in this manner introduce a compounded error by relying upon the average value of the measured parameter, which leads to only a rough estimate of what an optimized set point may be for a given optimizable variable. This residual does not take into consideration the difference between the nominal value and the measured value for each measurable parameter. The Applicant has found that the approach to sum of squares analysis compounds the error inherent in basing such a calculation on only an average measured value, as the average measured value does not reflect the nominal value, or in other words the target or desired value, for the measurable parameter.

Thus, what the Applicant refers to as the true residual is a more accurate measurement of the impact that changing each optimizable variable has on the measurable parameters of each output, by comparing the measured value of the measurable parameter against the required value for that measurable parameter, as follows:

$$(N_i - x_{ijk})^2$$

wherein $N_i$ is the required value of the i-th measurable parameter and $x_{ijk}$ is the measured value of a unit of the output, for the i-th measurable parameter. As such, the true residual is calculated with the following equation:

$$R_{1,2} = \frac{\sum_{i=1 \to m} \sum_{i=1 \to m, j=1 \to 5,8, k=1 \to (n+1)/2} (N_i - x_{ijk})^2}{N_i^2}$$

wherein, $R_{1,2}$ is the summation residual of all the measurable parameters (i=1 to m), calculated independently for each set point of the first and second set points of each optimizable variable; $N_i$ is the required value for the i-th measurable parameter; $x_{ijk}$ is the measured value of the measurable parameter for each output unit, X, for the i-th measurable parameter, where j is the number of output units measured (for example, in the keyhole part case study, there are five output units obtained from each trial); and k is the number of trials that reflect the usage of either the first or second set points, where k+k=n+1 (so for example, in the keyhole part case study, k was equal to six trials of the twelve trials that utilized the first set point and six trials of the twelve trials that utilized the second set point for each optimizable variable).

By way of example, without intending to be limiting, a truncated example of how the first and second residuals corresponding to the first and second set points for the optimizable variable of the hold pressure, in the keyhole part case study, is set out below (also, see Tables 5 through 11, above, for the measurable parameter data set out for each of the twelve trials, and also see Table 4, which indicates that the first set point of 110 bar for the hold pressure optimizable variable was utilized in Trials 1-6 and that the second set point of 100 bar for the hold pressure optimizable variable was utilized in Trials 7-12).

$$R_1 = ((150 - 150.75)^2 + (150 - 150.8)^2 + \ldots (150 - 149.22)^2)/150^2 +$$
$$((70 - 70.35)^2 + \ldots (70 - 69.62)^2)/70^2 +$$
$$\ldots ((100 - 99.4)^2 + \ldots (100 - 98.8)^2)/100^2 = 0.0173524$$

and $$R_2 = ((150 - 149.25)^2 + (150 - 149.3)^2 + \ldots (150 - 147.9)^2)/150^2 +$$
$$((70 - 69.65)^2 + \ldots (70 - 68.95)^2)/70^2 +$$
$$\ldots ((100 - 99)^2 + \ldots (100 - 98.1)^2)/100^2 = 0.0519583$$

Thus, the first true residual $R_1$ for the first set point of the first optimizable variable, where hold pressure is 110 bar, is calculated to be 0.0173524, and the second true residual $R_2$ for the second set point of the first optimizable variable, where hold pressure is 100 bar, is calculated to be 0.0519583. Similarly, the first and second true residuals for the first and second set points of each of the eleven optimizable variables, in the keyhole part case study, are set out in Table 12, below. Completing the calculation of the first and second true residuals for each of the optimizable variables completes step 118 of the method.

TABLE 12

Process Optimization Analysis and Results
Optimizable Variables

|  | Hold Pressure bar | Cooling Time sec | Mold Temp F. | Injection Speed mm/sec | Hold Time sec | Back Pressure bar |
|---|---|---|---|---|---|---|
| Residual 1 | 0.0173524 | 0.0350788 | 0.0170895 | 0.0458932 | 0.0376001 | 0.0429963 |
| Residual 2 | 0.0519583 | 0.0351569 | 0.0522211 | 0.0234175 | 0.0317105 | 0.0263143 |
| Set Point 1-High | 110 | 15 | 155 | 35 | 14 | 7 |
| Set Point 2-Low | 100 | 12 | 140 | 28 | 11 | 4 |
| Interpolant | 107.5 | 13.5 | 151.3 | 30.4 | 12.4 | 5.1 |
| Extrapolant | 115.0 | 1362.5 | 162.3 | 20.7 | -5.2 | -0.7 |
| Extrapolant % | 4.6 | 8983.5 | 4.7 | 40.8 | 136.8 | 110.5 |

$Y = Ax^2 + Bx + C$ where x is your set point and Y is your Residual. Interpolant is at "0" Residual.

|  | | | | | | |
|---|---|---|---|---|---|---|
| A= | 0.0013862 | 0.0156079 | 0.0006161 | 0.002829 | 0.0154024 | 0.0154024 |
| B= | -0.294565 | -0.421441 | -0.18409 | -0.175017 | -0.383096 | -0.163865 |
| C= | 15.646356 | 2.8448993 | 13.749366 | 2.7059397 | 2.3820789 | 0.4353379 |

|  | Cut Off Pressure bar | Full Cut Off % | Decomp Afterfeed bar | Feed Speed mm/sec | Barrel Temp 1 F. |
|---|---|---|---|---|---|
| Residual 1 | 0.03457650 | 0.0283279 | 0.032112 | 0.038699 | 0.0247141 |
| Residual 2 | 0.0347341 | 0.0409827 | 0.0371986 | 0.0306117 | 0.0445965 |
| Set Point 1-High | 140 | 95 | 6 | 23 | 400 |
| Set Point 2-Low | 120 | 92 | 3 | 18 | 380 |
| Interpolant | 130.0 | 93.8 | 4.6 | 20.2 | 392.9 |
| Extrapolant | 4527.5 | 101.7 | 24.9 | 0.9 | 424.9 |
| Extrapolant % | 3133.9 | 7.1 | 315.7 | 104.0 | 6.2 |

$Y = Ax^2 + Bx + C$ where x is your set point and Y is your Residual. Interpolant is at "0" Residual.

|  | | | | | |
|---|---|---|---|---|---|
| A= | 0.0003466 | 0.0154024 | 0.0154024 | 0.0055449 | 0.0003466 |
| B= | -0.090112 | -2.88446 | -0.140317 | -0.225721 | -0.271306 |
| C= | 5.8577727 | 135.04571 | 0.3195277 | 2.2970653 | 53.098441 |

Figure 4:
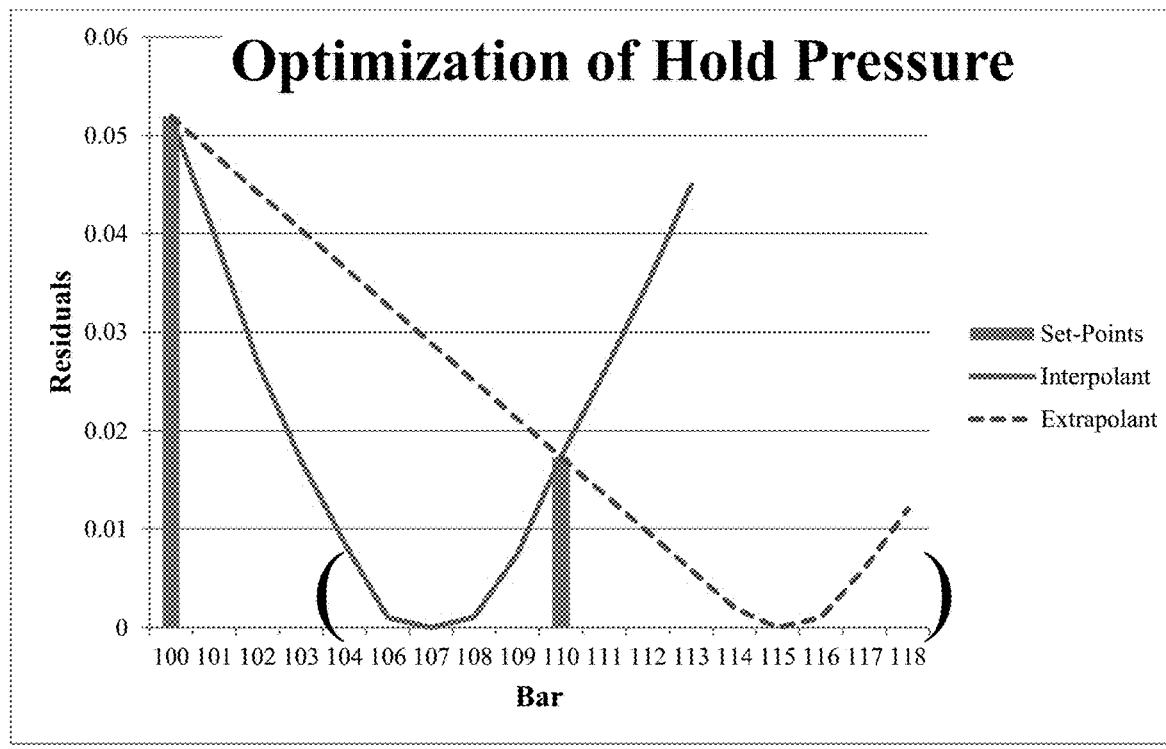
FIG. 4 illustrates a graph displaying first and second true residual values, as well as calculated extrapolant and interpolant for an optimizable variable such as hold pressure.

Referring again to FIG. 2, step 120 of the method involves calculating the extrapolant outside the first and second true residuals, and the interpolant between the first and second true residuals, for each optimizable variable, utilizing standard engineering interpolation and extrapolation techniques. For the keyhole part case study, the calculated interpolants and extrapolants are provided in Table 12 above. A graph (Graph 1) displaying the first and second true residual values, as well as the calculated extrapolant and interpolant, is shown in FIG. 4 for the optimizable variable, hold pressure.

Referring to Graph 1 and Table 12, it may thus be seen that the first and second true residuals for the first and second set points of the hold pressure are marked on the x-axis of Graph 1 (vertical bars), the interpolant between the first and second true residuals represented by the solid line and the extrapolant outside the first and second true residuals represented by the broken line. Where the extrapolant and interpolant are equal to zero residual, in the example above at 107.5 bar and 115 bar respectively, indicates what the optimized value of the optimizable variable may be. As shown in Table 12, the zero value of each extrapolant and interpolant is provided.

Referring again to FIG. 2, step 122 of the method involves applying a set of identification rules to select, as between the zero values of the interpolant and the extrapolant, the optimized value of each optimizable variable. In some embodiments of the present disclosure, one of the identification rules is to eliminate an extrapolant or interpolant value that falls outside the range of possible values for that optimizable variable. For example, as shown in Table 12, the extrapolant for the optimizable variable, cooling time, is 1362.5 seconds, which falls well outside the range of 12 to 15 seconds selected for the first and second set points. As another example, the negative values for the extrapolants of the optimizable variables of injection speed, back pressure and hold time may be eliminated as it is not possible to have negative values for these optimizable variables. As a further example of the application of the rule eliminating extrapolant values that fall outside the possible range of values for that optimizable variable, the variable full cut off percentage has an extrapolant value of 101.7%, which again falls outside the possible range of values and may be eliminated.

In some embodiments of the present disclosure, a further identification rule of the set of identification rules may be to accept the interpolant value as the optimized value where the calculated percentage of the extrapolant as compared to the highest set point of the two set points is greater than a threshold percentage value. For example, without intending to be limiting, the threshold percentage value for the extrapolant as compared to the highest set point value of the first and second set point values may be as high as 20%, depending on the process being optimized and the optimizable variable at issue. As applied to the keyhole part case study example, as shown in Table 12, the calculated value of Extrapolant % (as compared to the highest set point) exceeds 20% for most of the optimizable variables, with the exception of the following four optimizable variables: hold pressure, mold temperature, full cut off %, and barrel temperature. Regarding the full cut off % optimizable variable, because of the application of the first rule to eliminate any extrapolant values that fall outside the range of possible values for that optimizable variable (in this case, 101.7% which exceeds the maximum possible value of 100% for that optimizable variable), despite that the Extrapolant % is less than 20% (at 7.1%), we may be confident that the optimized value for the Full Cut Off % optimizable variable is equal to 93.8%.

However, for the remaining three optimizable variables (namely hold pressure, mold temperature and barrel temperature), application of the rule that for any optimizable variable having an Extrapolant % value of less than 20%, further investigation may be required before the optimized value for each of those optimizable variables may be determined. In the embodiment of the method illustrated in FIG. 2, if further investigation of the identified optimizable variables to determine the true optimized set point for those variables is not required for a given process, then at step 126, the optimized variables for which optimized set points were found are adjusted to those optimized set points, and the set points for the other optimizable variables may be selected by, for example, reviewing the available data and judging whether the interpolant value or the previously used set point value should be used as the set point for that variable going forward.

Figure 3A:
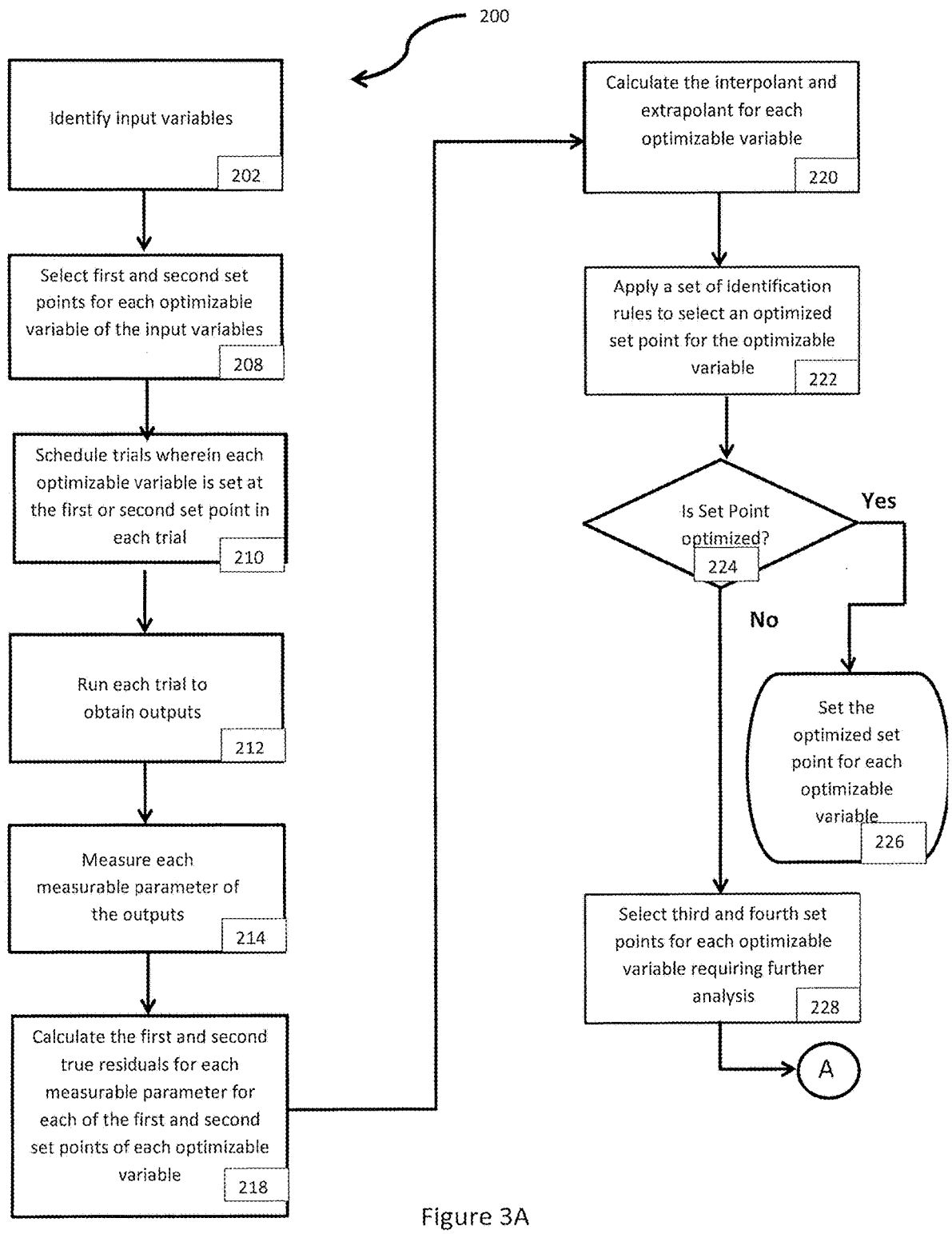
Figure 3B:
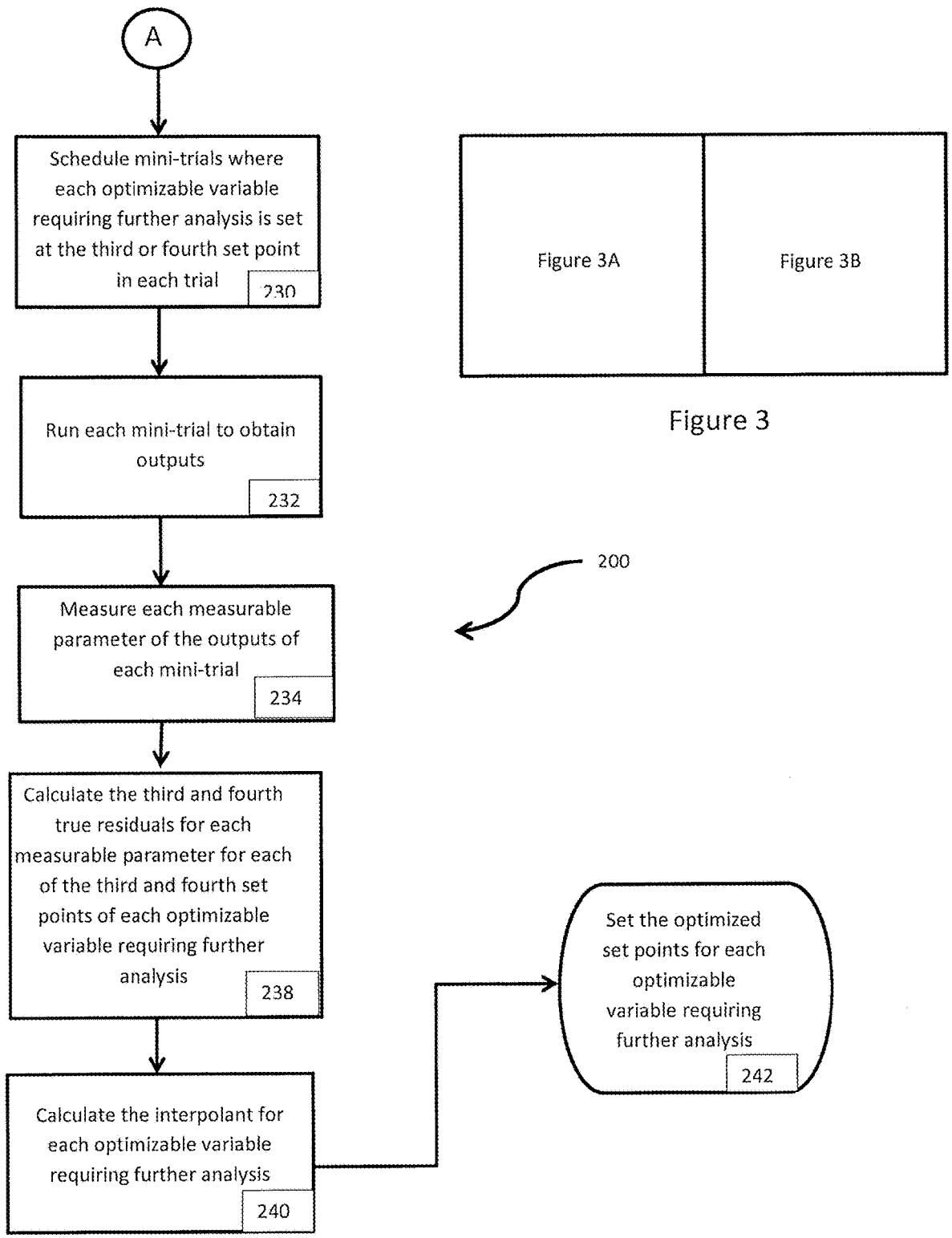

In other embodiments of the present disclosure, such as the method illustrated in FIGS. 3A and 3B, the optimizable variables may be subject to a further set of mini-trials to identify the optimized set point for those variables. Referring now to FIG. 3A, steps 202 through 222 of method 200 are the same as steps 102 through 122 of method 100 illustrated in FIG. 2 and described above. However, as shown in FIG. 3A, after the identification rules are applied at step 222 to select an optimized set point for each of the optimizable variables, the method proceeds to step 224 where the optimizable variables for which the set point has not been optimized are identified. For those optimizable variables in which the optimized set point has been identified, at step 226 those optimizable variables are adjusted to the optimized set point. And for the optimizable variables determined to require further investigation to determine the true optimized value, at step 224, the method proceeds to step 228, in which step, third and fourth set points for each optimizable variable requiring further investigation and analysis are selected.

At step 228, the third and fourth set points for each optimizable variable requiring further analysis are selected by examining the extrapolant and interpolant calculated from the initial set of trials run in step 212. In some embodiments of the present disclosure, the third and fourth set points may be selected so as to be slightly above and below the interpolant and extrapolant values previously calculated in the first set of trials run in method 100. In the keyhole part example, the hold pressure may have a third and fourth set point of 105 and 118 bar, which are respectively slightly below and slightly above the interpolant of 107.5 bar and the extrapolant of 115 bar (shown in Table 12, above). Similarly, the third and fourth set points of 148 F and 165 F are slightly below and above the extrapolant and interpolant values of 151.3 F and 162.3 F for the mold temperature optimizable variable; and the third and fourth set points of 390 F and 427 F are slightly below and above the extrapolant and interpolant values of 392.9 F and 424.9 F for the barrel tip temperature optimizable variable. However, a person skilled in the art will appreciate that other rules for selecting the third and fourth set points for the mini trials proceeding under method 200 may also work and are intended to fall within the scope of the present disclosure.

TABLE 13

Mini-Trial Optimizable Variables - Optimizable Variable Set Points

| Optimizable Variable | Set Point 3 | Set Point 4 | Units |
|---|---|---|---|
| Hold Pressure | 105 | 118 | bar |
| Mold Temperature | 148 | 165 | F. |
| Barrel Temperature Tip | 390 | 427 | F. |

In step 230, a series of mini trials are scheduled whereby, similar to the trial scheduling step 210 for the initial set of trials, the design of experiments for the mini-trials are designed to include a combination of the third or fourth set points for each optimizable variable to be further investigated in the mini-trials. Returning to the example of the keyhole part case study, in Table 14 it may be seen that the predetermined variables include each of the predetermined variables utilized in the first set of trials (namely, the six barrel temperatures being held at 500 F, 500 F, 500 F, 500 F, 460 F and 420 F, respectively), as well as the eight optimizable variables that were previously optimized in step 226 (namely, the cooling time, injection speed, hold time, back pressure, cut off pressure, full cut off, decompression afterfeed and feed speed), each of which are set at the optimized set points uncovered in the initial set of trials (as shown below in Table 14, cooling time is set at 13.5 seconds, as it is the interpolant value, or optimized value, for cooling time found in Table 12). Thus, as there are three optimizable variables being examined in the mini-trials of the keyhole part case study, there will be four mini-trials scheduled in which the third and fourth set points for each of the optimizable variables are paired together in various combinations, shown in the matrix of set points displayed in Table 15 below.

TABLE 14

Mini-Trial Optimizable Variables - Predetermined Variable Inputs

| Predetermined Variables | Values | Units |
|---|---|---|
| Cooling Time | 13.5 | sec |
| Injection Speed | 30.4 | mm/sec |
| Hold Time | 12.4 | sec |
| Back pressure | 5.1 | bar |
| Cut Off Pressure | 130 | bar |
| Full Cut Off | 93.8 | % |
| Decompression Afterfeed | 4.6 | bar |
| Feed Speed | 20.2 | mm/sec |
| Barrel Temp 1 | 500 | F. |
| Barrel Temp 2 | 500 | F. |
| Barrel Temp 3 | 500 | F. |
| Barrel Temp 4 | 500 | F. |
| Barrel Temp 5 | 460 | F. |
| Barrel Temp 6 | 420 | F. |

TABLE 15

Mini-Trial Design - Matrix of Optimizable Variables

| Mini-Trials | Hold Pressure bar | Mold Temperature F. | Barrel Temperature Tip F. |
|---|---|---|---|
| 1 | 118 | 165 | 427 |
| 2 | 118 | 148 | 390 |
| 3 | 105 | 165 | 390 |
| 4 | 105 | 148 | 427 |

In step 232 of method 200, each of the mini-trials scheduled in step 230 are run, so as to produce a sufficient amount of output for further statistical analysis. In the keyhole part case study, for example, eight output units may be obtained from each mini-trial, so as to obtain 112 measured values relating to each set point of each optimizable variable (calculated by multiplying seven measurable parameters by two trials using each set point by eight output units output from each trial; or in other words, 7×2×8=112), thereby attaining the at least 50 measured values required to attain a statistical accuracy of at least 95% or greater. Again, this is not intended to be limiting and it will be appreciated that other amounts of output units may be obtained from each mini-trial to attain different thresholds of statistical accuracy that may be greater or lesser than 95%, and are intended to fall in the scope of the present disclosure.

In step 234 of method 200, the measurable parameters of each output unit obtained from each mini-trial run in step 232 are measured. Tables 16 through 22 (below) provide the results, respectively, for each measurable parameter of each output unit of the eight output units obtained from each mini-trial in the keyhole example; specifically, the measured length X of body 12 for each output unit of each of the four mini-trials is shown in Table 16; the measured width Y of body 12 for each output unit is shown in Table 17; the measured depth Z of body 12 for each output unit is shown in Table 18; the measured slot width A of slot 18 for each output unit is shown in Table 19; the measured diameter D of each aperture 14 for each output unit is shown in Table 20; the measured mass of output unit is shown in Table 21; and the percent of good output units obtained from each mini-trial is shown in Table 22.

TABLE 16

Mini-Trial Measured Values of Measurable parameter, Length (X)
Required Value for Measureable Variable—Length (X)—150 mm

| | Output Products | | | | | | | |
|---|---|---|---|---|---|---|---|---|
| Trials | 1 | 2 | 3 | 4 | 5 | 6 | 7 | 8 |
| 1 | 150.75 | 150.8 | 150.85 | 150.7 | 150.8 | 150.7 | 150.75 | 150.7 |
| 2 | 149.8 | 149.95 | 149.85 | 149.9 | 149.85 | 149.85 | 149.8 | 149.95 |
| 3 | 148.8 | 148.95 | 148.9 | 148.85 | 149 | 148.95 | 148.9 | 148.9 |
| 4 | 149 | 149.2 | 149.2 | 149.1 | 149.3 | 149.1 | 149.3 | 149.25 |

TABLE 17

Mini-Trial Measured Values of Measurable parameter, Width (Y)
Required Value for Measureable Variable—Width (Y)—70 mm

| | Output Products | | | | | | | |
|---|---|---|---|---|---|---|---|---|
| Trials | 1 | 2 | 3 | 4 | 5 | 6 | 7 | 8 |
| 1 | 70.4 | 70.3 | 70.35 | 70.42 | 70.38 | 70.32 | 70.36 | 70.4 |
| 2 | 70.1 | 69.85 | 69.95 | 69.93 | 69.98 | 69.96 | 70 | 69.97 |
| 3 | 69.9 | 69.8 | 69.85 | 69.9 | 69.94 | 69.93 | 69.97 | 69.95 |
| 4 | 69.5 | 69.4 | 69.42 | 69.52 | 69.57 | 69.59 | 69.58 | 69.56 |

TABLE 18

Mini-Trial Measured Values of Measured Variable, Depth (Z)
Required Value for Measureable Variable—Depth (Z)—10 mm

| | Output Products | | | | | | | |
|---|---|---|---|---|---|---|---|---|
| Trials | 1 | 2 | 3 | 4 | 5 | 6 | 7 | 8 |
| 1 | 10.12 | 10.13 | 10.11 | 10.1 | 10.08 | 10.09 | 10.1 | 10.11 |
| 2 | 10 | 9.99 | 10.01 | 9.98 | 10 | 9.97 | 9.98 | 9.99 |
| 3 | 9.8 | 9.85 | 9.9 | 9.94 | 9.92 | 9.88 | 9.89 | 9.85 |
| 4 | 9.8 | 9.83 | 9.88 | 9.9 | 9.82 | 9.82 | 9.85 | 9.86 |

TABLE 19

Mini-Trial Measured Values of Measurable parameter, Slot Width (A)
Required Value for Measureable Variable—Slot Width (A)—2 mm

| | Output Products | | | | | | | |
|---|---|---|---|---|---|---|---|---|
| Trials | 1 | 2 | 3 | 4 | 5 | 6 | 7 | 8 |
| 1 | 2.02 | 2.01 | 2.01 | 2.01 | 2.02 | 2.01 | 2 | 2.01 |
| 2 | 2 | 1.99 | 2.01 | 1.99 | 1.99 | 2 | 1.99 | 1.99 |
| 3 | 1.98 | 1.99 | 1.97 | 1.98 | 1.97 | 1.99 | 1.98 | 1.98 |
| 4 | 1.98 | 1.98 | 1.96 | 1.97 | 1.97 | 1.98 | 1.97 | 1.97 |

TABLE 20

Mini-Trial Measured Values of Measurable parameter, Diameter (D)
Required Value for Measureable Variable—Diameter (D)—25 mm

| | Output Products | | | | | | | |
|---|---|---|---|---|---|---|---|---|
| Trials | 1 | 2 | 3 | 4 | 5 | 6 | 7 | 8 |
| 1 | 24.57 | 24.61 | 24.55 | 24.6 | 24.63 | 24.65 | 24.59 | 24.58 |
| 2 | 25.03 | 25.01 | 24.99 | 25 | 24.98 | 24.99 | 25.03 | 25.02 |
| 3 | 25.05 | 25.04 | 25.12 | 25.08 | 25.07 | 25.06 | 25.06 | 25.05 |
| 4 | 25.06 | 25.07 | 25.1 | 25.09 | 25.08 | 25.09 | 25.07 | 25.06 |

TABLE 21

Mini-Trial Measured Values of Measurable parameter, Mass
Required Value for Measureable Variable—Mass 75 Units: mm

| | Output Products | | | | | | | |
|---|---|---|---|---|---|---|---|---|
| Trials | 1 | 2 | 3 | 4 | 5 | 6 | 7 | 8 |
| 1 | 75.85 | 75.9 | 75.88 | 75.91 | 75.86 | 75.87 | 75.89 | 75.86 |
| 2 | 75.02 | 74.96 | 74.98 | 75.01 | 75.02 | 74.97 | 74.99 | 74.98 |
| 3 | 74.98 | 74.95 | 74.97 | 74.98 | 74.99 | 74.95 | 74.96 | 74.97 |
| 4 | 74.96 | 74.95 | 74.96 | 74.94 | 74.97 | 74.94 | 74.95 | 74.85 |

TABLE 22

Mini-Trial Measured Values of Measurable parameter, Percent Good
Required Value for Measureable Variable—Percent Good 100 Unit: %

| | Output Products | | | | | | | |
|---|---|---|---|---|---|---|---|---|
| Trials | 1 | 2 | 3 | 4 | 5 | 6 | 7 | 8 |
| 1 | 94 | 94 | 95 | 93 | 94 | 95 | 93 | 94 |
| 2 | 99 | 99 | 99 | 98 | 99 | 98 | 98 | 99 |
| 3 | 98 | 99 | 98 | 97 | 98 | 97 | 98 | 98 |
| 4 | 98 | 97 | 97 | 96 | 97 | 98 | 97 | 97 |

In step 238 of method 200, the third and fourth true residuals are each calculated, for example, following the same steps and calculations set out and described above in relation to step 118 of method 100, but utilizing the measured values of the measurable parameters obtained in step 234 of method 200. For example, referring to the keyhole part case study, the measurable parameter data set out in Tables 16 through 22 (above) would be utilized in step 238 to obtain the third and fourth true residuals for each optimizable variable subject to experimentation in the mini-trials. The results of the true residual calculations are set out in Table 23, below.

TABLE 23

Process Optimization Analysis and Results (Mini-Trials)

| | Optimizable Variables | | |
|---|---|---|---|
| | Hold Pressure bar | Mold Temperature F. | Barrel Temperature Tip F. |
| True Residual 3 | 0.035898304 | 0.040632617 | 0.045224804 |
| True Residual 4 | 0.017843535 | 0.013109222 | 0.008517036 |
| Set Point 3 - High | 118 | 165 | 427 |
| Set Point 4 - Low | 105 | 148 | 390 |
| Interpolant | 109.3 | 152.1 | 395.9 |
| Extrapolent | 92.2 | 139.9 | 381.4 |
| Extrapolent % | 21.9 | 15.2 | 10.7 |

$Y = Ax^2 + Bx + C$ where x is your set point and Y is your Residual.
Interpolant is at "0" Residual.

| A = | 0.000635998 | 0.000371916 | 7.85125E−05 |
| B = | −0.140438748 | −0.114790636 | −0.06315265 |
| C = | 7.752033038 | 8.855678724 | 12.69629206 |

In step 240 of method 200, the interpolant for each of the third and fourth residuals for each of the optimizable variables examined in the mini-trials are calculated. In step 242, the interpolant values calculated in step 240 are set as the optimized set points for each of the optimizable variables requiring further analysis through the mini-trials. All the optimized set points for each of the optimizable variables have now be determined and may be used to improve the efficiency and quality of the output(s), using only two iterations of trials, including the initial set of trials run in step 212 and a smaller set of mini-trials run in step 232.

Thus, in the Applicant's experience, the process optimization methods and systems described herein may be utilized to improve the efficiency of a wide variety of processes. For example, various different manufacturing processes may have their efficiencies improved by applying the methods described herein. As earlier described, the same methods may be applied to adjust the set points in real time or near-real time, based on a comparison of the measured outputs from the process, measured in real time or near-real time. As an example, not intending to be limiting, in the chemical industry the output(s) are typically several minutes downstream of the process. It is important to recognize that all processes are required to stabilize to achieve uniform data acceptable to any transition in variable changes upstream.

The results from data, or optimizable variables, may also be trended against one or more external or internal factors. For example, the performance of a vehicle engine may be continually optimized utilizing the process optimization methods described herein. Once the data has been trended to include other external or internal factors, such as weather conditions, driving conditions, or style of driving, then the vehicle could instantaneously provide optimized settings for fuel efficiency, or any other required output. Using this technology within advanced process control the optimal responses could be learned through conditions set by a program following the pattern of analysis described herein.

What is claimed is:

1. A method for optimizing a plurality of input variables for a physical process so as to improve one or more outputs of the physical process, the method performed in part by a processor executing instructions in tangible memory, the method comprising the steps of:
   a) identifying a plurality of optimizable variables of the physical process,
   b) determining first and second set points for each optimizable variable of the plurality of optimizable variables,
   c) scheduling a plurality of first trials of the physical process wherein each trial of the plurality of first trials utilizes one of the first and second set points for each of the optimizable variables,
   d) running each trial of the plurality of first trials to obtain a plurality of first trial outputs, each first trial output of the plurality of first trial outputs having a plurality of measurable parameters,
   e) measuring each measurable parameter of the plurality of measurable parameters of each first trial output of the plurality of first trials so as to generate a plurality of measured values for each measurable parameter,
   f) calculating a delta between each measured value of said plurality of measured values and a corresponding required value of each measurable parameter of the plurality of measurable parameters of each first trial output so as to obtain a plurality of said deltas for each of the first and second set points of each of the optimizable variables,
   g) calculating a first true residual for the first set point by summation of the square of each delta of each measurable parameter divided by the square of the required value corresponding to the measurable parameter for the first set point, wherein each delta is calculated between each measured value of said plurality of measured values and a corresponding required value of each measurable parameter of the plurality of measurable parameters,
   h) calculating a second true residual for the second set point by summation of the square of each delta of each measurable parameter divided by the square of the required value corresponding to the measurable parameter for the second set point, wherein each delta is calculated between each measured value of said plurality of measured values and a corresponding required value of each measurable parameter of the plurality of measurable parameters,
   i) calculating an interpolant between the first and second true residuals and an extrapolant outside the first and second true residuals for each of the optimizable variables,
   j) applying a set of identification rules to select an optimized set point for each of the optimizable variables selected from a group comprising: a zero value of the interpolant of the first and second true residuals of the optimizable variable and a zero value of the extrapolant of the first and second true residuals of the optimizable variable,
   k) modifying the physical process by implementing said optimized set point for each optimizable variable so as to improve the output of the physical process,
   wherein the physical process is a manufacturing process and the output of the physical process is an article of manufacture, and wherein the step of modifying the physical process so as to improve the output of the physical process includes improving the efficiency of the process by reducing a percent wastage of the manufacturing process.

2. The method of claim 1 wherein, in step (i), if the applying of the set of identification rules does not result in the selecting of the optimized set point for at least one of the optimizable variables, then the method further includes the steps of:
   l) identifying the at least one optimizable variable of the plurality of optimizable variables for which the optimized set point remains to be determined;
   m) determining third and fourth set points for each of the optimizable variables of the identified at least one optimizable variable;
   n) scheduling a plurality of second trials of the physical process wherein each trial of the plurality of second trials utilizes the third or fourth set point for each optimizable variable of the at least one optimizable variable;
   o) running each second trial of the plurality of second trials to obtain a plurality of second trial outputs, each second trial output of the plurality of second trial outputs having the plurality of measurable parameters;
   p) measuring each measurable parameter of the plurality of measurable parameters of each second trial output obtained from each trial of the plurality of second trials so as to generate a second plurality of measured values for each measurable parameter,
   q) calculating the delta between each measured value of said second plurality of measured values and the corresponding required value of each measurable parameter of the plurality of measurable parameters of each of the second trial outputs, so as to obtain a second plurality of deltas for each of the third and fourth set points of each optimizable variable of the at least one optimizable variable;

r) calculating a third true residual for the third set point by summation of the square of each delta of each measurable parameter divided by the square of the required value corresponding to the measurable parameter for the third set point, wherein each delta is calculated between each measured value of said plurality of measured values and a corresponding required value of each measurable parameter of the plurality of measurable parameters;

s) calculating a fourth true residual for the fourth set point by summation of the square of each delta of each measurable parameter divided by the square of the required value corresponding to the measurable parameter for the fourth set point, wherein each delta is calculated between each measured value of said plurality of measured values and a corresponding required value of each measurable parameter of the plurality of measurable parameters;

t) calculating a second interpolant between the third and fourth true residuals of each optimizable variable of the at least one optimizable variable;

u) implementing the optimized set point for each optimizable variable of the at least one optimizable variable, the optimized set point being the second interpolant for that optimizable variable, so as to improve the output of the physical process.

3. The method of claim 1 wherein, the step of identifying a plurality of optimizable variables of the physical process further includes identifying one or more predetermined variables and determining a set point for each predetermined variable of the one or more predetermined variables;

and, wherein the step of scheduling the plurality of first trials of the physical process further includes setting each predetermined variable at the determined set point for each trial of the plurality of fir trials.

4. The method of claim 1 wherein, the step of running each trial of the plurality of first trials to obtain a plurality of first trial outputs of the physical process further includes running each trial of the plurality of first trials to obtain a quantity of first trial outputs producing the plurality of deltas sufficient to provide optimized set points having a statistical accuracy of at least 95%.

5. The method of claim 1 wherein, the step of determining the first and second set points for each optimizable variable of the plurality of optimizable variables includes determining the first set point to be a presently utilized value and determining the second set point to be selected from a group comprising: a value in the range of substantially 10%-25% less than the presently utilized value and a value in the range of substantially 10%-25% greater than the presently utilized value.

6. A method for real-time optimization of input variables for a physical process so as to improve one or more outputs of the physical process, the method performed in part by a processor executing instructions in tangible memory, the method comprising the steps of:

a) identifying a plurality of optimizable variables of the physical process, b) determining first and second set points for each optimizable variable of the plurality of optimizable variables, c) scheduling a plurality of first trials of the physical process wherein each trial of the plurality of first trials utilizes one of the first and second set points for each of the optimizable variables, d) running each trial of the plurality of first trials to obtain a plurality of first trial outputs, each first trial output of the plurality of first trial outputs having a plurality of measurable parameters, e) measuring each measurable parameter of the plurality of measurable parameters of each first trial output of the plurality of first trials so as to generate a plurality of measured values for each measurable parameter, f) calculating a delta between each measured value of said plurality of measured values and a corresponding required value of each measurable parameter of the plurality of measurable parameters of each first trial output so as to obtain a plurality of said deltas for each of the first and second set points of each of the optimizable variables, g) calculating a first true residual for the first set point by summation of the square of each delta of each measurable parameter divided by the square of the required value corresponding to the measurable parameter for the first set point, wherein each delta is calculated between each measured value of said plurality of measured values and a corresponding required value of each measurable parameter of the plurality of measurable parameters, h) calculating a second true residual for the second set point by summation of the square of each delta of each measurable parameter divided by the square of the required value corresponding to the measurable parameter for the second set point, wherein each delta is calculated between each measured value of said plurality of measured values and a corresponding required value of each measurable parameter of the plurality of measurable parameters, i) calculating an interpolant between the first and second true residuals and an extrapolant outside the first and second true residuals for each of the optimizable variables, j) applying a set of identification rules to select an optimized set point for each of the optimizable variables selected from a group comprising: a zero value of the interpolant of the first and second true residuals of the optimizable variable and a zero value of the extrapolant of the first and second true residuals of the optimizable variable, k) modifying the physical process by implementing the said optimized set point for each optimizable variable so as to improve the output of the physical process, l) repeating steps (a) through (k) on a plurality of subsequent trials so as to continuously optimize the plurality of optimizable variables in near-real time, wherein the physical process is a manufacturing process and the output of the physical process is an article of manufacture, and wherein the step of modifying the physical process so as to improve the output of the physical process includes improving the efficiency of the process by reducing a percent wastage of the manufacturing process.

7. The method of claim 6 wherein, in step (j), if the applying of the set of identification rules does not result in the selecting of the optimized set point for at least one of the optimizable variables, then prior to performing step (k) of modifying the process, the method further includes the steps of:

m) identifying the at least one optimizable variable of the plurality of optimizable variables for which the optimized set point remains to be determined;

n) determining third and fourth set points for each of the optimizable variables of the identified at least one optimizable variable;

o) scheduling a plurality of second trials of the physical process wherein each trial of the plurality of second trials utilizes the third or fourth set point for each optimizable variable of the at least one optimizable variable;

p) running each second trial of the plurality of second trials to obtain a plurality of second trial, each second trial output of the plurality of second trial outputs having the plurality of measurable parameters;

q) measuring each measurable parameter of the plurality of measurable parameters of each second trial output obtained from each trial of the plurality of second trials so as to generate a plurality of measured values for each measurable parameter, r) calculating the delta between each measured value of said second plurality of measured values and the corresponding required value of each measurable parameter of the plurality of measurable parameters of each of the second trial outputs, so as to obtain a second plurality of deltas for each of the third and fourth set points of each optimizable variable of the at least one optimizable variable;

s) calculating a third true residual for the third set point and a fourth true residual for the fourth set point of each optimizable variable of the at least one optimizable variable, wherein each delta is calculated between each measured value of said plurality of measured values and a corresponding required value of each measurable parameter of the plurality of measurable parameters;

t) calculating a second interpolant between the third and fourth true residuals of each optimizable variable of the at least one optimizable variable;

u) setting the optimized set point for each optimizable variable of the at least one optimizable variable, the optimized set point being the second interpolant for that optimizable variable.

8. The method of claim 6 wherein, the step of identifying a plurality of optimizable variables of the process further includes identifying one or more predetermined variables and determining a set point for each predetermined variable of the one or more predetermined variables; and wherein the step of scheduling the plurality of first trials of the physical process further includes setting each predetermined variable at the determined set point for each trial of the plurality of first trials.

9. The method of claim 6 wherein, the step of running each trial of the plurality of first trials to obtain a plurality of first trial outputs of the physical process further includes running each trial of the plurality of first trials to obtain a quantity of first trial outputs producing the plurality of deltas sufficient to provide optimized set points having a statistical accuracy of at least 95%.

10. The method of claim 6 wherein, the step of determining the first and second set points for each optimizable variable of the plurality of optimizable variables includes determining the first set point to be a presently utilized value and determining the second set point to be selected from a group comprising: a value in the range of substantially 10%-25% less than the presently utilized value and a value in the range of substantially 10%-25% greater than the presently utilized value.

* * * * *